United States Patent [19]

Berry et al.

[11] 4,141,055
[45] Feb. 20, 1979

[54] CROSSOVER STRUCTURE FOR MICROELECTRONIC CIRCUITS

[75] Inventors: Robert W. Berry, Bethlehem; David Feldman; Arnold Pfahnl, both of Allentown, all of Pa.

[73] Assignee: Bell Telephone Laboratories, Incorporated, Murray Hill, N.J.

[21] Appl. No.: 791,285

[22] Filed: Apr. 27, 1977

[51] Int. Cl.² ............................................. H05K 1/04
[52] U.S. Cl. ................... 361/410; 174/68.5; 252/63.2; 252/63.5; 361/411; 427/96; 428/308
[58] Field of Search ............... 361/410, 411; 252/63.2, 252/63.5; 174/68.5; 428/308; 427/96

[56] References Cited

U.S. PATENT DOCUMENTS

| | | | |
|---|---|---|---|
| 2,850,687 | 9/1958 | Hammes | 357/72 |
| 3,461,524 | 8/1969 | Lepselter | 29/25.42 |
| 3,670,091 | 6/1972 | Frantz | 174/52 PE |
| 3,672,985 | 6/1972 | Nathanson et al. | 427/89 |
| 3,681,134 | 8/1972 | Nathanson et al. | 427/89 |
| 3,821,611 | 6/1974 | Bacher | 361/411 |
| 3,830,776 | 8/1974 | Carlson et al. | 260/37 EP |
| 3,988,647 | 10/1976 | Bolon et al. | 361/411 |
| 4,000,054 | 12/1976 | Marcantonio | 174/68.5 |

*Primary Examiner*—John D. Smith
*Attorney, Agent, or Firm*—Lester H. Birnbaum

[57] ABSTRACT

Disclosed is a crossover structure and method of fabricating such structure which contributes low capacitance to the circuit performance. The crossover utilizes a dielectric material which includes spheres of an insulating material in order to separate the conductors. In one aspect of the invention, a UV curable epoxy including hollow glass spheres is deposited on the crosspoint areas and the crossover connector deposited thereon. In another aspect of the invention, the crossover is formed with an air gap and the gap is subsequently filled with an encapsulating material including the spheres.

4 Claims, 10 Drawing Figures

CROSSOVER STRUCTURE FOR MICROELECTRONIC CIRCUITS

BACKGROUND OF THE INVENTION

This invention relates to microelectronic circuits, and in particular to a method of fabrication and a resulting structure for providing crossover connections in such circuits.

Microelectronic circuits such as hybrid integrated circuits employing thin film and silicon integrated circuit chip elements on an insulating substrate enjoy extensive use in sophisticated information processing applications. This has required larger and more complex circuits. The circuits therefore include many areas where it is necessary for conductors placed in a first direction to cross over conductors running in other directions. Typically, such crossover connections are fabricated by plating the crossover on a spacing layer which is then removed to leave an air gap between the crossover connection and the conductor on the substrate which is being crossed. (See, for example, U.S. Pat. No. 3,672,985, issued to Nathanson, et al). Alternatively, an arched conductor element may be bonded to the ends of the conductor on the substrate in order to cross over an intervening conductor. Although such structures are generally satisfactory, they possess the disadvantage that they are not rigid structures, and that during handling the crossover can be shorted to the conductor being crossed. It has therefore been proposed to provide an insulating layer over the conductor being crossed wherein there is a gap between the crossover and insulating layer (see, for example, U.S. Pat. No. 3,461,524, issued to Lepselter) or the crossover is deposited directly on the insulator (see, for example, U.S. Pat. No. 4,000,054, issued to Marcantonio). These structures introduce a crosspoint capacitance which can decrease the circuit frequency response or increase the signal propagation delay. In addition, when the crossover is deposited directly on the dielectric, poor adhesion can result when the coefficient of expansion of the dielectric is not matched to that of the metal and ceramic substrate.

It is therefore an object of the invention to achieve rigid crossover structures with low capacitance which therefore do not significantly impair overall electrical circuit performance.

SUMMARY OF THE INVENTION

This and other objects are achieved in accordance with the invention by the inclusion of spheres of an insulating material within a dielectric which separates the crossover connection from the conductor on the substrate. In one embodiment of the invention, a UV curable epoxy including glass spheres distributed throughout is deposited in the area to be crossed. The crossover conductor is then formed on the dielectric. In an alternative embodiment, the crossovers are formed with an air gap, and subsequently an encapsulant including insulating glass spheres is applied over the circuit so that the encapsulant fills in the gap.

BRIEF DESCRIPTION OF THE DRAWING

These and other features of the invention will be delineated in detail in the following description. In the drawing.

It will be appreciated that for purposes of illustration these figures are not drawn to scale.

DETAILED DESCRIPTION

One embodiment of the invention will be described with reference to FIGS. 1–4 which illustrate the fabrication of a crossover in various stages. A portion of a microelectronic circuit is shown in cross-section in FIG. 1. The substrate, 10, is an insulating material which is typically a ceramic. Formed thereon is a pair of conductors, 11, which run parallel to the plane of the figure and a conductor 12 which runs perpendicular thereto. It will, of course, be appreciated that a typical microelectronic circuit includes many conductors as well as elements such as resistors and capacitors formed on the same substrate, with silicon integrated circuits bonded thereto.

Figure 1:
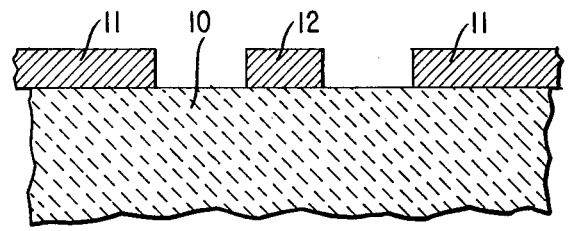
FIGS. 1–4 are cross-sectional views of a portion of a microelectronic circuit during various stages of fabrication illustrating one embodiment of the invention.
Figure 2A:
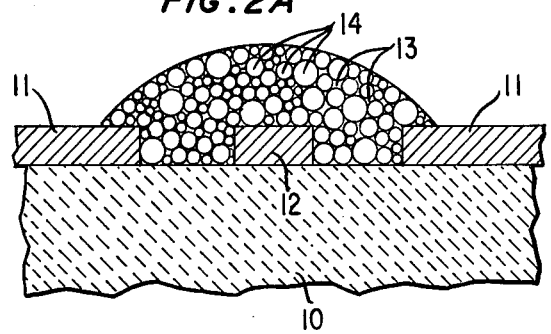
Figure 2B:
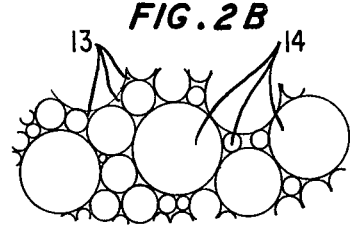

In order to form a crossover connection between the pair of conductors, 11, a dielectric material is deposited over the conductor 12 and substrate as illustrated in FIG. 2A. In accordance with a major feature of the invention, the dielectric comprises an insulating material 13 which has distributed throughout a plurality of hollow spheres 14. A magnified cross-sectional view of the dielectric is shown in FIG. 2B. In this embodiment, the insulating material was a UV curable epoxy, in particular a mixture of bisphenol-A and epichlorhydrin which is sold by the 3-M Company under the designation UV curable Epoxy No. 1301. The spheres were made of glass or silica, and in this embodiment were microspheres sold by Emerson & Cuming, Inc. under the trademark Eccospheres SI. The spheres constituted approximately 25 percent by weight of the dielectric, although a range of 10–50 percent appears useful. This corresponds to approximately 40–90% by volume of the dielectric. A preferred size of the spheres is a distribution of diameters in the range 2–44 $\mu$m. It is preferred to choose the size of the spheres and their proportion so that the volume ratio of spheres to epoxy is maximized without forming voids in the matrix. A volume ratio as low as 1:1 can provide a sufficiently low capacitance in the final crossover structure while maintaining a close match of expansion coefficient between the dielectric and conductors.

In the preparation of the dielectric, the epoxy and spheres are mixed first by hand and then in a standard 3 roll mixer along with approximately 1–5 percent of silica filler such as that sold by Cabot under the tradename Cab-O-Sil in order to make the mixture screenable. Four to six passes in the mill were found to distribute the spheres evenly.

The dielectric was applied to the circuit by standard screen printing techniques to form a patch approximately 50–75 $\mu$m thick as shown in FIG. 2A. After deposition, the material was immediately cured by exposure to an ultra-violet light source such as that produced by a Gyrex 6 KW unit for approximately 10 to 60 seconds. Rapid curing after screening was found to prevent any runout of the screened pattern. the screened pattern.

In cases where a chlorinated solvent is utilized in the subsequent circuit fabrication, a thermal curing cycle after the UV curing was found beneficial. Curing at a temperature of 100° to 200° C. for 1 to 4 hours made the dielectric particularly resistant to such solvents.

Figure 3:
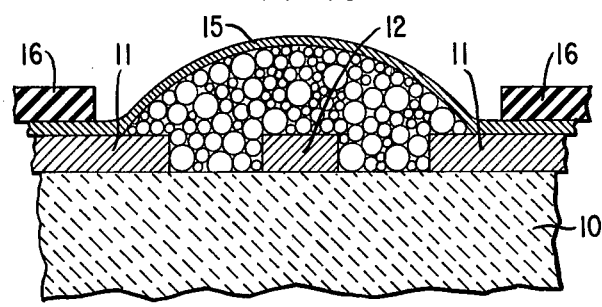
Figure 4:
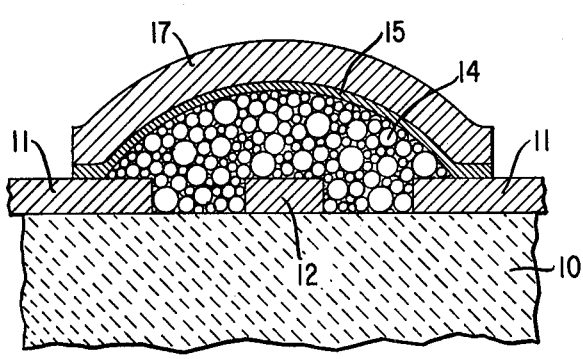

As shown in FIG. 3, the crossover connection was then constructed by first evaporating a layer of copper, 15, over the entire circuit to a thickness in the range of 0.5 to 1.0 μm. Heating the substrate to a temperature of approximately 100° C. insured good adhesion of the copper to the dielectric although heating to a temperature of 50°–150° C. appears useful. Electroless deposition appears to be an alternative to evaporation of the copper layer. A photoresist layer, 16, was applied and developed according to standard photolithographic technique in order to expose the area of the crossover. The crossover beam, 17, was then formed, as shown in FIG. 4, by plating additional copper in the exposed area to a thickness in the range of 20–25μ. The crossover structure was completed by stripping the photoresist and etching off the portions of the evaporated copper layer, 15, which had not been built up during the plating step.

Test patterns having each approximately 1100 crossover structures in series were fabricated in accordance with the above technique for the purpose of testing capacitance, adhesion qualities and reliability. It was found, in general, that the cross point capacitance had been reduced by approximately 15% as a result of inclusion of the spheres in the dielectric. It therefore appears that the crosspoint capacitance of a crosspoint with 125 μm wide conductors can be kept below 0.06 μF by inclusion of the spheres. Tape tests also showed that the inclusion of the spheres improved the adhesion between the crossover and dielectric. This is believed to be due to the fact that the coefficient of expansion of the dielectric is significantly reduced (from approximately $250 \times 10^{-6}$ per degrees C. to an estimated $10–50 \times 10^{-6}$ per degrees C.) and is therefore more closely matched to the substrate and metallization.

Figure 5:
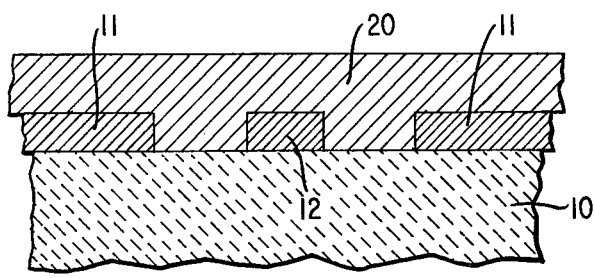
FIGS. 5–9 are cross-sectional views of a portion of a microelectronic circuit during various stages of fabrication illustrating a further embodiment of the invention.
Figure 6:
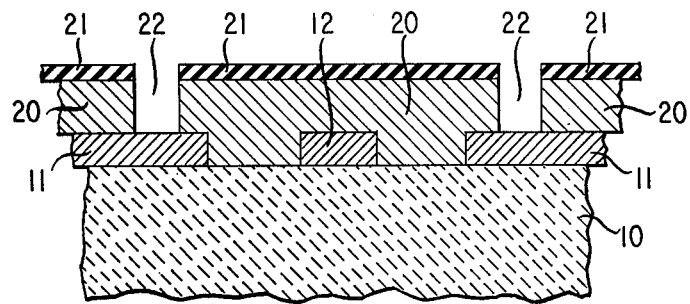
Figure 7:
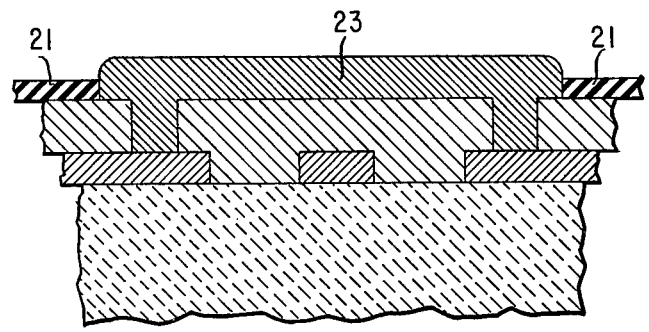
Figure 8:
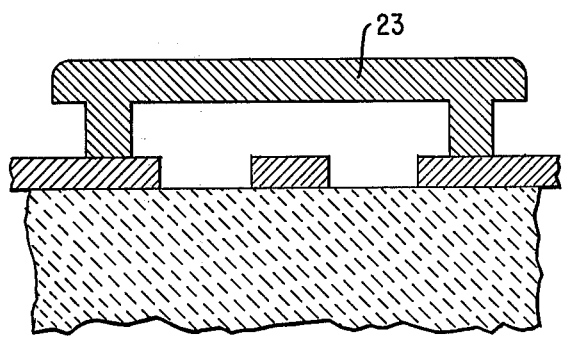
Figure 9:
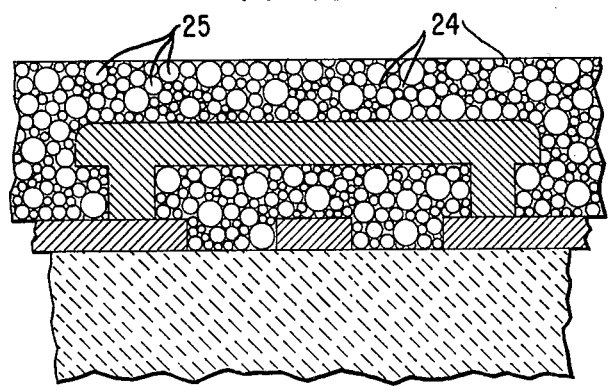

The basic crossover structure shown in FIG. 4 can also be achieved by an alternative method in accordance with a further embodiment of the invention. In accordance with this embodiment, the crossover is fabricated with an air gap in accordance with standard techniques. Such crossover fabrication is taught, for example, in U.S. Pat. No. 3,461,524 issued Aug. 19, 1969 to Lepselter. One such technique is shown in the sequence of events depicted in FIGS. 5–8. Starting with the same structure as in FIG. 4, a spacing layer, 20, comprising copper is deposited on the substrate as shown in FIG. 5. A photoresist layer, 21 of FIG. 6, is applied and developed in order to expose the areas of the pillar holes. These pillar holes, 22 are then etched through the spacing layer to expose a portion of the conductors 11. The photoresist is re-developed in order to define the areas of the crossover, and the crossover beam 23 is deposited in this area as shown in FIG. 7. The photoresist is removed and the spacing layer is selectively etched in order to form the air-isolated crossover structure shown in FIG. 8. (See also, U.S. Pat. No. 3,769,108 issued Oct. 30, 1973 to Feldman, et al.) When the circuit is completed, an encapsulating material, 24, which includes the hollow insulating spheres, 25 is applied over the entire circuit as shown in FIG. 9. This encapsulant should migrate to the area under the crossover beam in order to provide protection from the environment and support for the beam. It is therefore expected to help prevent shorts while keeping the capacitance low.

The particular encapsulant used may be a room temperature vulcanizing (RTV) silicone rubber sold by Dow Corning under the designation DC 3-6550. This material is basically a dimethyl siloxane long chain polymer with methoxy end groups, dissolved in xylene. Of course, other encapsulants could be used, including RTV silicone rubber encapsulants in general. The spheres can be the same glass microspheres sold by Emerson and Cuming and described for the previous embodiment. The spheres may be added to the encapsulant in amounts ranging from approximately 1.0 to 12% by weight so as to give a percent by volume of the spheres in the cured RTV ranging frpm approximately 8.8–52.1%. It is expected that a useful range would be 5–55% by volume of spheres in the cured encapsulant. The encapsulant and spheres may again by mixed in a roll mixer. The encapsulant may be applied to the circuit and then cured according to standard techniques, e.g., approximately 16 hours at 25 degrees C. plus approximately 6 hours at 120 degrees C.

Preliminary results showed that the thermal expansion coefficient of the encapsulants with spheres was significantly reduced to approximately $24 \times 10^{-6}$ per degrees C. as compared to approximately $270 \times 10^{-6}$ per degrees C. of the RTV alone. It is expected that the capacitance will also be reduced by inclusion of the spheres.

Various additional modifications will become apparent to those skilled in the art. All such variations which basically rely on the teachings through which the invention has advanced the art are properly considered within the spirit and scope of the invention.

What is claimed is:

1. In a micro-electronic circuit including circuit elements and conductors formed on an insulating substrate, a crossover structure comprising:

first and second conductors formed on the substrate and a third conductor formed on the substrate between said first and second conductors;

a dielectric material formed over said third conductor in the area between said first and second conductors, said dielectric including an ultraviolet curable epoxy and at least 50 percent by volume of a plurality of hollow spheres with diameters in the range 2–44 μm comprising a material selected from the group consisting of glass and silica, said material having a coefficient of expansion no greater than $50 \times 10^{-6}$ per degrees C.; and a crossover beam contacting said first and second conductors, said beam adhering to and supported by said dielectric.

2. The crossover structure according to claim 1 wherein the volume ratio of spheres to epoxy is a maximum without forming voids in the material.

3. The crossover structure according to claim 1 wherein the dieletric material is 50–75 μm thick and the conductors are approximately 125 μm wide, whereby a crosspoint capacitance of less than 0.06 μF. is produced.

4. In a micro-electronic circuit including circuit elements and conductors formed on an insulating substrate, a crossover structure comprising:

first and second conductors formed on the substrate and a third conductor formed on the substrate between said first and second conductors;

a crossover beam extending over said third conductor and contacting said first and second conductors; and a dielectric encapsulating material formed over said circuit and included in the area under said crossover beam, said material comprising a room temperature vulcanizing silicone rubber and 5–55% by volume of a plurality of hollow spheres with diameters in the range 2–44 μm comprising a material selected from the group consisting of glass and silica, said material having a thermal coefficient of expansion of no greater than approximately $24 \times 10^{-6}$ per degrees C.

* * * * *